US012694911B2

(12) United States Patent
Umetsu et al.

(10) Patent No.: US 12,694,911 B2
(45) Date of Patent: Jul. 28, 2026

(54) MAGNETIC MEMORY

(71) Applicant: Kioxia Corporation, Tokyo (JP)

(72) Inventors: Nobuyuki Umetsu, Kawasaki
Kanagawa (JP); Tsuyoshi Kondo,
Kawasaki Kanagawa (JP); **Naoharu
Shimomura, Meguro Tokyo (JP); Shiho
Nakamura**, Kawasaki Kanagawa (JP);
Susumu Hashimoto, Nerima Tokyo
(JP); Yasuaki Ootera, Yokohama
Kanagawa (JP); Yoshihiro Ueda,
Yokohama Kanagawa (JP)

(73) Assignee: Kioxia Corporation, Tokyo (JP)

( * ) Notice: Subject to any disclaimer, the term of this
patent is extended or adjusted under 35
U.S.C. 154(b) by 575 days.

(21) Appl. No.: 18/179,280

(22) Filed: Mar. 6, 2023

(65) Prior Publication Data

US 2024/0055028 A1 Feb. 15, 2024

(30) Foreign Application Priority Data

Aug. 9, 2022 (JP) ................................ 2022-127338

(51) Int. Cl.
| | |
|---|---|
| *G11C 5/08* | (2006.01) |
| *G11C 11/16* | (2006.01) |
| *H10B 61/00* | (2023.01) |
| *H10N 50/10* | (2023.01) |

(52) U.S. Cl.
CPC ............ *G11C 5/08* (2013.01); *G11C 11/1675*
(2013.01); *H10B 61/00* (2023.02); *H10N
50/10* (2023.02)

(58) Field of Classification Search
CPC ....... G11C 5/08; G11C 11/1675; H10B 61/00;
H10N 50/10
See application file for complete search history.

(56) References Cited

U.S. PATENT DOCUMENTS

| | | | | |
|---|---|---|---|---|
| 9,293,696 B2 * | 3/2016 | Ootera | .................. | G11C 11/161 |
| 9,515,123 B2 * | 12/2016 | Nakamura | ............. | H10B 61/00 |
| 9,799,383 B2 * | 10/2017 | Hosotani | ................ | H10N 50/10 |
| 10,032,499 B2 | 7/2018 | Kado et al. | | |
| 10,403,381 B2 * | 9/2019 | Quinsat | .................. | H10N 50/85 |
| 2019/0088346 A1 * | 3/2019 | Ootera | ................... | H10B 61/22 |

(Continued)

FOREIGN PATENT DOCUMENTS

| | | |
|---|---|---|
| JP | 2017-143175 A | 8/2017 |
| JP | 2021-048240 A | 3/2021 |

(Continued)

OTHER PUBLICATIONS

U.S. Appl. No. 17/693,818, filed Mar. 14, 2022.

*Primary Examiner* — Christine S. Kim
*Assistant Examiner* — Nathalie R Fayette
(74) *Attorney, Agent, or Firm* — Kim & Stewart LLP

(57) ABSTRACT

According to one embodiment, a magnetic memory includes
a first magnetic member extending along a first direction.
First and second wires extend along a second direction. The
first magnetic member is located between the first and
second wirings in plan view from the first direction. A
second magnetic member has a first portion above the first
and second wirings, a second portion between the first and
second wirings, and a third portion below the first and
second wirings. At least one of the first portion or the third
portion of the second magnetic member has a lower satu-
ration magnetization than the second portion.

20 Claims, 12 Drawing Sheets

(56)                    References Cited

U.S. PATENT DOCUMENTS

| 2021/0083001 A1 | 3/2021 | Yoshimizu | |
| 2021/0280635 A1 | 9/2021 | Tokuhira et al. | |
| 2022/0076723 A1* | 3/2022 | Shimomura | H10B 61/00 |
| 2022/0077383 A1 | 3/2022 | Kondo et al. | |
| 2022/0302370 A1* | 9/2022 | Umetsu | H10B 61/10 |
| 2023/0076828 A1* | 3/2023 | Shimomura | H10N 50/80 |

FOREIGN PATENT DOCUMENTS

| JP | 2021-141250 A | 9/2021 |
| JP | 2022-045204 A | 3/2022 |

* cited by examiner

MEMORY UNIT

25c

MAGNETIC MEMORY

CROSS-REFERENCE TO RELATED APPLICATION(S)

This application is based upon and claims the benefit of priority from Japanese Patent Application No. 2022-127338, filed Aug. 9, 2022, the entire contents of which are incorporated herein by reference.

FIELD

Embodiments described herein relate generally to a magnetic memory.

BACKGROUND

There is a type of magnetic memory in which a domain wall of a magnetic member is moved (shifted) by applying a current to the magnetic member. In such a magnetic memory, information is written to the magnetic member by applying a current to a field line and using the magnetic field generated by this current. In the magnetic memory of this type, it is difficult to obtain a sufficiently strong magnetic field for efficient writing of information.

DETAILED DESCRIPTION

Figure 1:
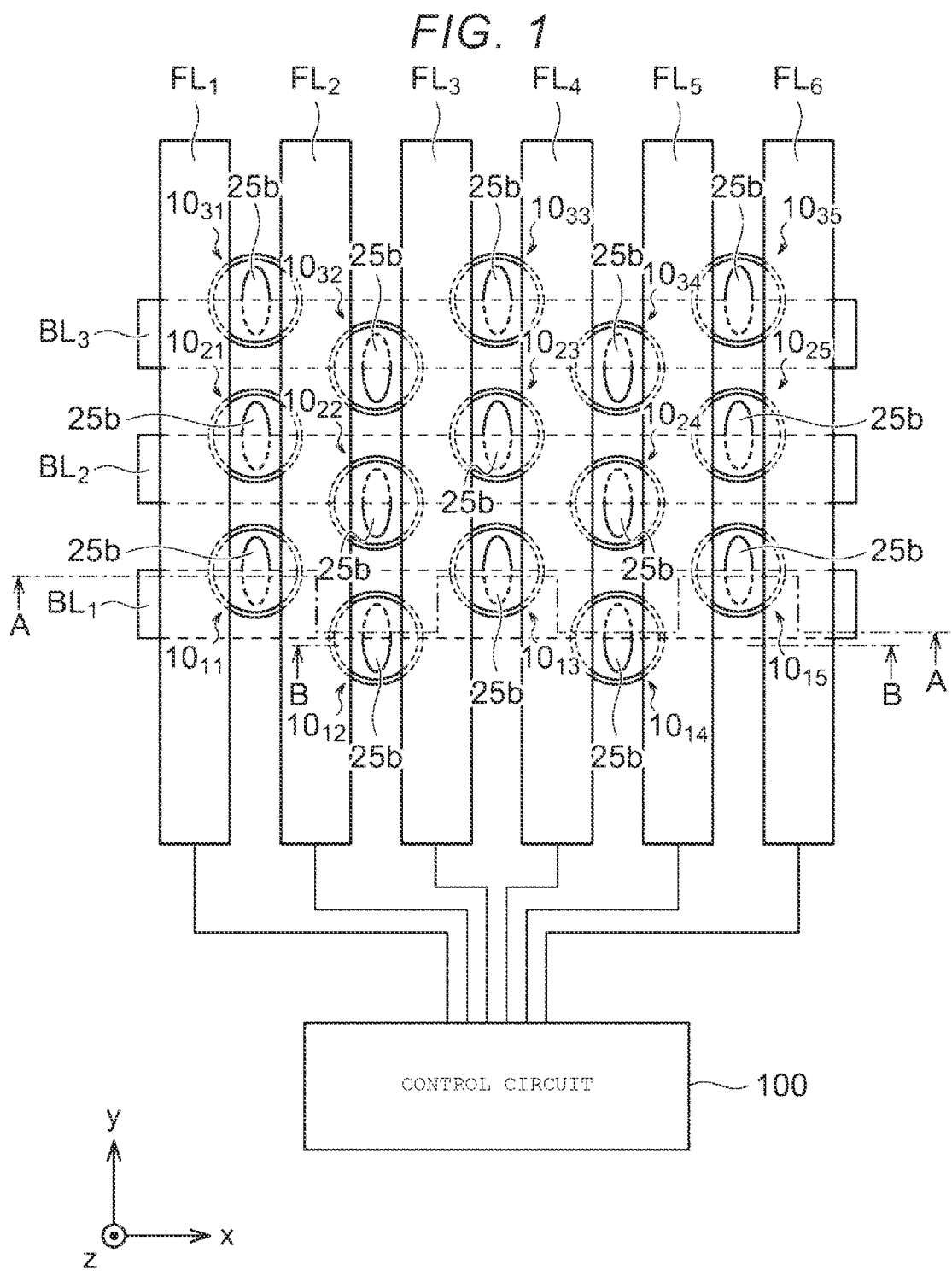
FIG. 1 is a plan view of a magnetic memory according to a first embodiment.

Embodiments relate to a magnetic memory capable of improving efficiency in writing of information.

In general, according to one embodiment, a magnetic memory includes a plurality of first magnetic members. Each first magnetic member extends along a first direction and has a first end portion and a second end portion. A first wiring and a second wiring are spaced apart from a first magnetic member of the plurality first magnetic members on a second end portion side of the first magnetic member. The first and second wirings extend along a second direction intersecting with the first direction and are adjacent to each other in a third direction intersecting the first and second directions. The first magnetic member is located at a position between the first wiring and the second wiring in plan view from the first direction. A second magnetic member includes a first portion above the first wiring and the second wiring, a second portion between the first wiring and the second wiring, and a third portion below the first wiring and the second wiring. The second portion is electrically connected to the first portion. A third wiring is on a first end portion side of the first magnetic member and extends along the third direction. At least one of the first portion and the third portion has a lower saturation magnetization than the second portion.

Hereinafter, certain example embodiments of the present disclosure will be described with reference to the drawings. The present disclosure is not limited to these examples. The drawings are schematic or conceptual, and the depicted dimensions, ratios, and the like are not necessarily the same as those in an actual implementation. In the drawings, the same reference symbols are given to those elements that are the same or substantially the same as those already described and additional description of such repeated elements may be appropriately omitted after an initial description.

First Embodiment

Figure 2:
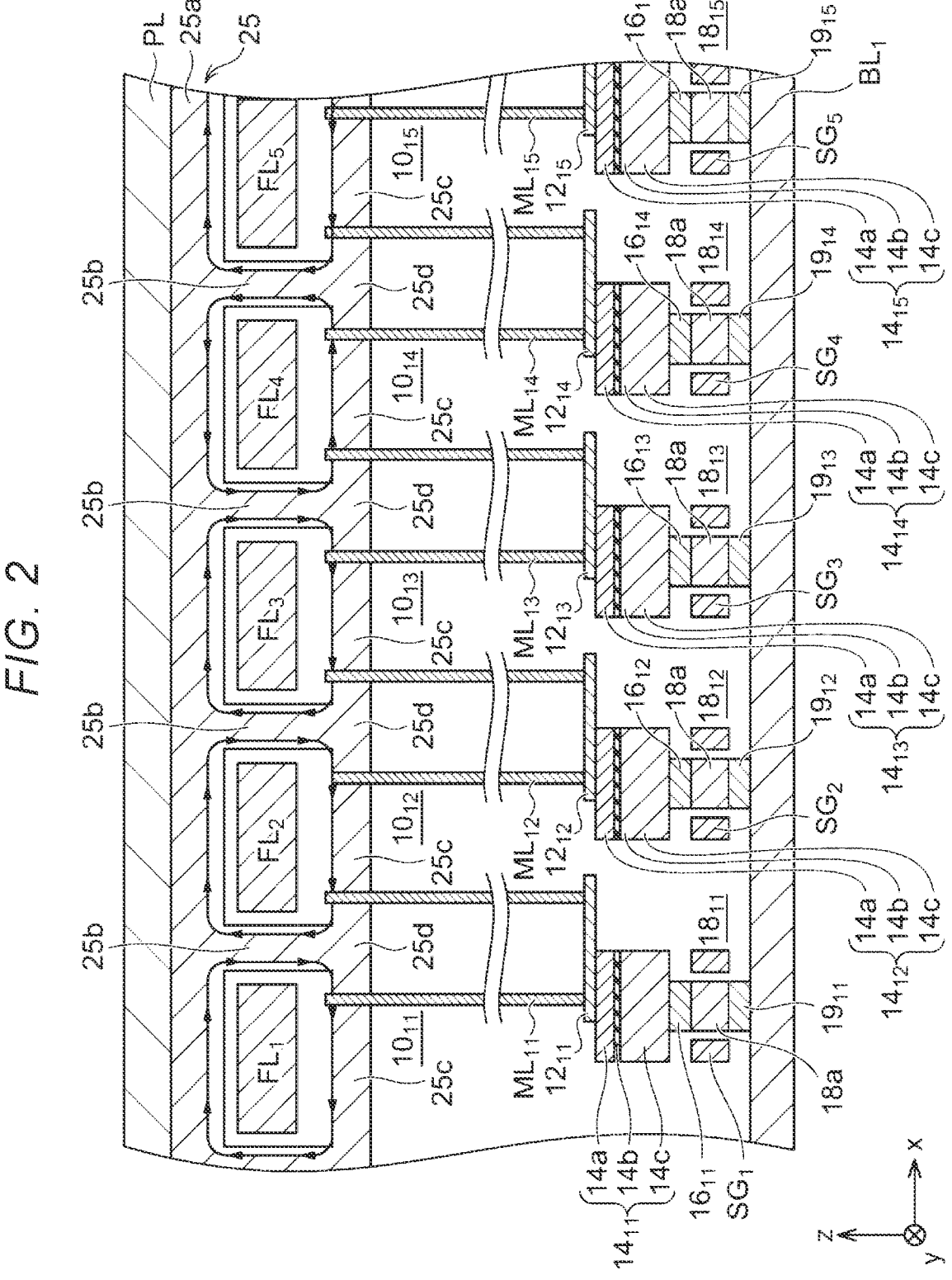
FIG. 2 is a cross-sectional view taken along a line A-A of FIG. 1.

FIG. 1 is a plan view of a magnetic memory according to a first embodiment. FIG. 2 is a cross-sectional view taken along a line A-A illustrated in FIG. 1. The magnetic memory of the first embodiment includes m rows and n columns (where m and n are natural numbers) of individual memory units $10_{ij}$ (where i=1 to m, j=1 to n). FIG. 1 illustrates the memory units $10_{11}$ to $10_{35}$ as arranged in 3 rows and 5 columns.

The memory units $10i1$ to $10in$ in the i-th row are arranged along a bit line $BL_i$ extending in the x-direction, and a first end portion (e.g., end portion $11a$ in FIG. 3) is electrically connected to the bit line $BL_i$. In the present specification, the phrase "A and B are electrically connected" means that A and B may be directly connected or indirectly connected via a conductor. In the i-th row, the memory units $10_{i1}$, $10_{i3}$, ... of the odd number columns and the memory units $10_{i2}$, $10_{i4}$, ... of the even number columns are displaced in an alternating upward-downward direction (y-direction) on the drawing. For example, the memory unit $10_{i2}$ of the even number column is provided between the memory unit $10_{i1}$ and the memory unit $10_{i3}$ of the odd number column, and is displaced (offset) in a −y-direction. By using such an arrangement, a plurality of memory units can be more densely arranged, and higher integration can be achieved.

Two adjacent field lines $FL_j$ and $FL_{j+1}$ (j=1 to n−1) are provided for each of the memory units $10_{1j}$ to $10_{mj}$ in a j-th column. In a plan view from the z-direction, the memory units $10_{1j}$ to $10_{mj}$ are located to face with each other between the field line $FL_j$ and the field line $FL_{j+1}$. In the plan view from the z-direction, the field line $FL_{j+1}$ may overlap a part of each j-th column memory unit $10_{ij}$ and a part of each j+1-th column memory unit $10_{ij+1}$. As illustrated in FIG. 2, the field line $FL_{j+1}$ is disposed above (in the +z-direction) a region between the j-th column memory unit $10_{ij}$ and the j+1-th column memory unit $10_{ij+1}$.

For example, the field line $FL_2$ and the field line $FL_3$ are provided for the memory unit $10_{i2}$ arranged in the second column. The memory unit $10_{i2}$ is located between the field line $FL_2$ and the field line $FL_3$, in the plan view in the z-direction. The field line $FL_2$ may overlap a part of each memory unit $10_{i1}$ in the first column and a part of each memory unit $10_{i2}$ in the second column, in the plan view in the z-direction. As illustrated in FIG. 2, the field line $FL_2$ is disposed above a region between the memory unit $10_{i1}$ in the first column and the memory unit $10_{i2}$ in the second column.

The field lines $FL_j$ (j=1 to n+1) extend along the y-direction and are adjacent to each other in the x-direction. The field line $FL_j$ intersects with the bit lines $BL_i$ extending in the x-direction. Each field line $FL_j$ is connected to, and controlled by, a control circuit 100. Each bit line $BL_i$ is also connected to, and controlled by, the control circuit 100.

As illustrated in FIG. 2, the field line $FL_j$ is provided on a second end portion (e.g., end portion 11b in FIG. 3) side of the memory unit $10_{ij}$, and is disposed apart from the memory unit $10_{ij}$. The field line $FL_j$ is electrically insulated from yokes 25a, 25b, 25c, 25d and the memory unit $10_{ij}$.

The yoke 25a is disposed above the memory unit $10_{ij}$. The yoke 25a is disposed above each and of all the field lines $FL_1$ to $FL_{n+1}$. In addition, a plate electrode PL electrically connected to the yoke 25a is in contact with, and covers, an upper surface of the yoke 25a. Further, the plate electrode PL is connected to, and controlled by, the control circuit 100. The yoke 25a is electrically connected to the plate electrode PL, and may be considered to function as a plate electrode.

The yokes 25b and 25d are provided integrally between each pair of the two adjacent field lines $FL_j$ and field line $FL_{j+1}$, and are electrically connected to the yoke 25a. The yoke 25c is provided below each of the field lines $FL_1$ to $FL_{n+1}$, and is electrically isolated from the yokes 25a, 25b, and 25d. The yoke 25c is, however, magnetically connected (coupled) to the yokes 25a, 25b, and 25d, and the yokes 25a, 25b, 25c, and 25d as a whole form a magnetic circuit.

As a material of the yokes 25a, 25b, 25c, and 25d, for example, an alloy containing a 3d transition metal (such as any of Fe, Co, and Ni) can be used.

The material of the yokes 25a and 25c can be different from the material of the yokes 25b and 25d so as to have a lower saturation magnetization than the material of the yokes 25b and 25d. As the material of the yokes 25a and 25c, for example, permalloy (a non-magnetic material may be added) or Heusler alloy used. In some examples, a material having a granular structure in which magnetic particles are densely dispersed in an insulator matrix may be used as the material of the yokes 25a and 25c.

As illustrated in FIG. 2, each memory unit $10_{ij}$ includes a magnetic memory line $ML_{ij}$ (also referred to as a magnetic member $ML_{ij}$) made of a conductive magnetic body, a non-magnetic conductive layer $12_{ij}$, a magnetoresistive element $14_{ij}$, a non-magnetic conductive layer $16_{ij}$, a vertical thin film transistor $18_{ij}$, and a non-magnetic conductive layer $19_{ij}$.

Figure 3:
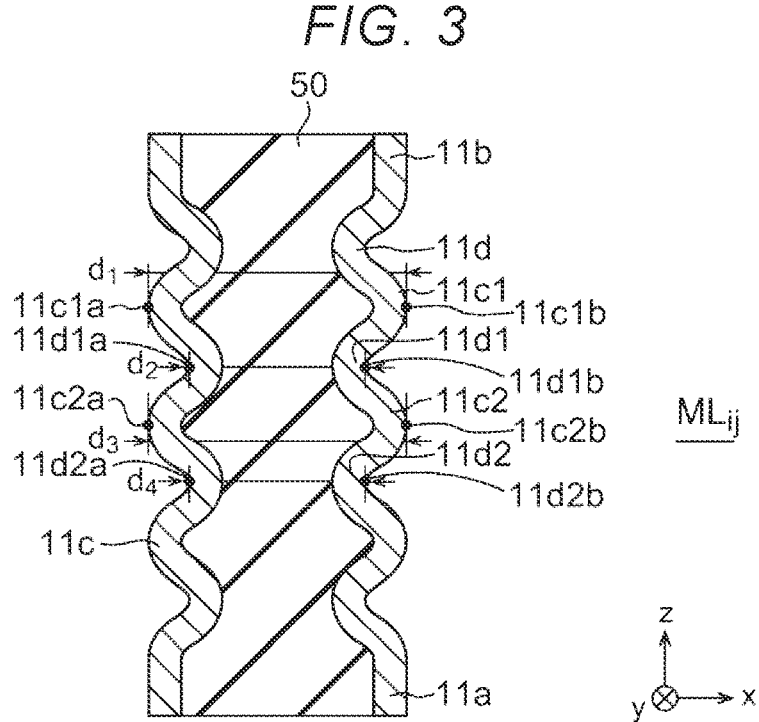
FIG. 3 is a cross-sectional view illustrating a magnetic member.

In FIG. 2, each magnetic member $ML_{ij}$ is configured with a vertical magnetic material extending in the upward-downward direction (z-direction), and has a cylindrical shape. FIG. 3 is a cross-sectional view illustrating a configuration example of the magnetic member $ML_{ij}$. A non-magnetic insulator 50 may be provided in a cylinder of each magnetic member $ML_{ij}$ That is, each magnetic member $ML_{ij}$ may surround the non-magnetic insulator 50. In the magnetic member $ML_{ij}$, as illustrated in FIG. 3, a region 11c1, a string portion 11d1, a region 11c2, and a string portion 11d2 are arranged along the z-direction. A distance (diameter) between an end portion 11c1a (outer edge) and an end portion 11c1b (outer edge) of the region 11c1 in the x-direction in a cross section of the region 11c1 along the z-direction is distance d1, a distance (diameter) between an end portion 11d1a (outer edge) and an end portion 11d1b (outer edge) of the string portion 11d1 in the x-direction in a cross section of the string portion 11d1 along the z-direction is distance d2, a distance (diameter) between an end portion 11c2a (outer edge) and an end portion 11c2b (outer edge) of the region 11c2 in the x-direction in a cross section of the region 11c2 along the z-direction is distance d3, and a distance (diameter) between an end portion 11d2a (outer edge) and an end portion 11d2b (outer edge) of the string portion 11d2 in the x-direction in a cross section of the string portion 11d2 along the z-direction is distance d4. In this case, the following conditions are satisfied:

d1>d2 and d1>d4,
d3>d2 and d3>d4

Each magnetic member $ML_{ij}$ has a first end portion 11a (see FIG. 3) electrically connected to the magnetoresistive element $14_{ij}$ via the non-magnetic conductive layer $12_{ij}$. In some examples, the non-magnetic conductive layer $12_{ij}$ may be omitted. In this case, the first end portion 11a of the magnetic member $ML_{ij}$ is directly connected to the magnetoresistive element $14_{ij}$. The bit line BL is provided on the first end portion 11a side of the magnetic member $ML_{ij}$ The bit line BL extends in the x-direction intersecting the field lines $FL_1$ to $FL_{n+1}$.

Each magnetic member $ML_{ij}$ has a second end portion 11b (see FIG. 3) electrically connected to the yoke 25d. The yoke 25d and the yoke 25c are magnetically connected (coupled). Here, in this context, "A is magnetically connected to B" means that A and B form a magnetic circuit, and includes a case in which the magnetic bodies so connected are not in direct contact with each other. The yoke 25c is provided facing the yoke 25a, and the field lines $FL_1$ to $FL_{n+1}$ are arranged between the yoke 25a and the yoke 25c. The yokes 25b and 25d are provided corresponding to each of the plurality of memory units $10_{ij}$, as illustrated in FIG. 1. The yoke 25d is disposed at a position in a center portion of the cylinder of each magnetic member $ML_{ij}$. The yoke d is located on the same layer as the yoke 25c and is magnetically connected to the yoke 25c which are laterally adjacent. The yoke 25b is disposed between the yokes 25a and 25d and is electrically and magnetically connected to the yokes 25a and 25d. The plate electrode PL is thus electrically connected in common for each memory unit $10_{ij}$.

Figure 4:
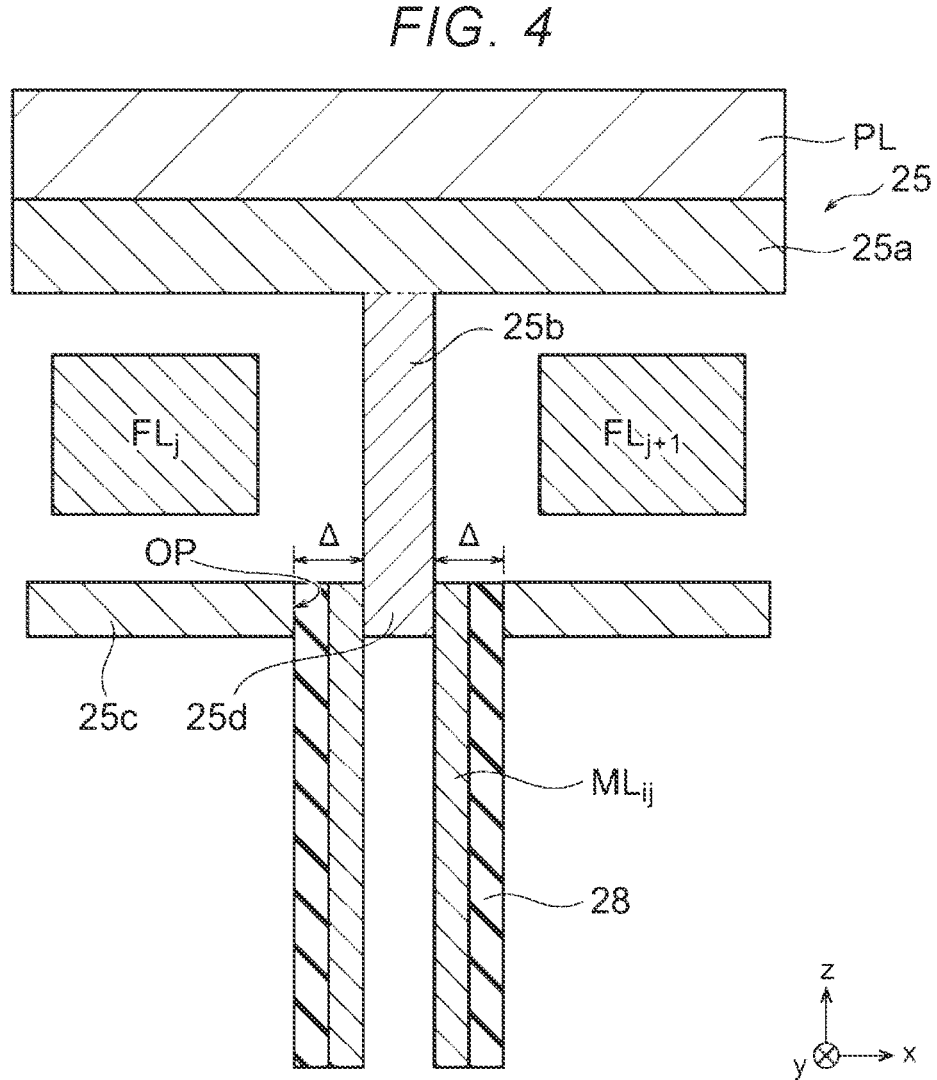
FIG. 4 is a cross-sectional view illustrating a configuration example of yokes.

The yoke 25a, the yoke 25b, the yoke 25c, and the yoke 25d constitute a magnetic circuit 25. A magnetic gap is provided in the magnetic circuit 25. FIG. 4 is a cross-sectional view illustrating a configuration example of the yokes and a periphery (surroundings) of the yokes. For example, as illustrated in FIG. 4, the yoke 25b has one end connected to the yoke 25a and the other end connected to the yoke 25d. The second end portion (end portion 11b in FIG. 3) of each magnetic member $ML_{ij}$ is provided in a magnetic gap that is between the corresponding yokes 25b and 25d on one side and the yoke 25c on the other side. The yoke 25d is electrically connected to an inner surface of an upper end portion of the corresponding magnetic member $ML_{ij}$. A non-magnetic insulating layer 28 is disposed on an outer side surface of each magnetic member $ML_{ij}$, and the yoke 25d is magnetically connected to the yoke 25c via this insulating layer 28. The insulating layer 28 is provided between the outer side surfaces of a plurality of magnetic members $ML_{ij}$ and the yoke 25c. That is, in the case illustrated in FIG. 4, a sum of the thickness of the magnetic member $ML_{ij}$ in the x-direction and the thickness of the insulating layer 28 in the x-direction is the distance of the magnetic gap $\Delta$. A magnetic gap $\Delta$ is located on either side of the yoke 25d in the x-direction.

Here, in the present embodiment, the material of the yokes 25a and 25c is different from the material of the yokes 25b and 25d, and saturation magnetization Ms of the yokes 25a and 25c is lower than the saturation magnetization Ms of the yokes 25b and 25d. For example, the saturation magnetization Ms of the yokes 25b and 25d is approximately 1500 emu/cm³, while the saturation magnetization Ms of the yokes 25a and 25c is approximately 500 emu/cm³. In this case, an exchange stiffness constant A of the yokes 25a and 25c is also lower than the exchange stiffness constant A of the yokes 25b and 25d. For example, the exchange stiffness constant A of the yokes 25b and 25d is approximately 1.5 uerg/cm, while the exchange stiffness constant A of the yokes 25a and 25c is approximately 0.5 uerg/cm. In this manner, by making the saturation magnetization Ms of the yokes 25a and 25c lower than the saturation magnetization Ms of the yokes 25b and 25d, it is possible to reduce variations and reductions in write magnetic field intensity according to the structure of the yokes 25a and 25c. A relationship between the structure of the yokes 25a, 25c and the material of the yokes 25b, 25d will be described below with reference to FIG. 13.

Figure 5:
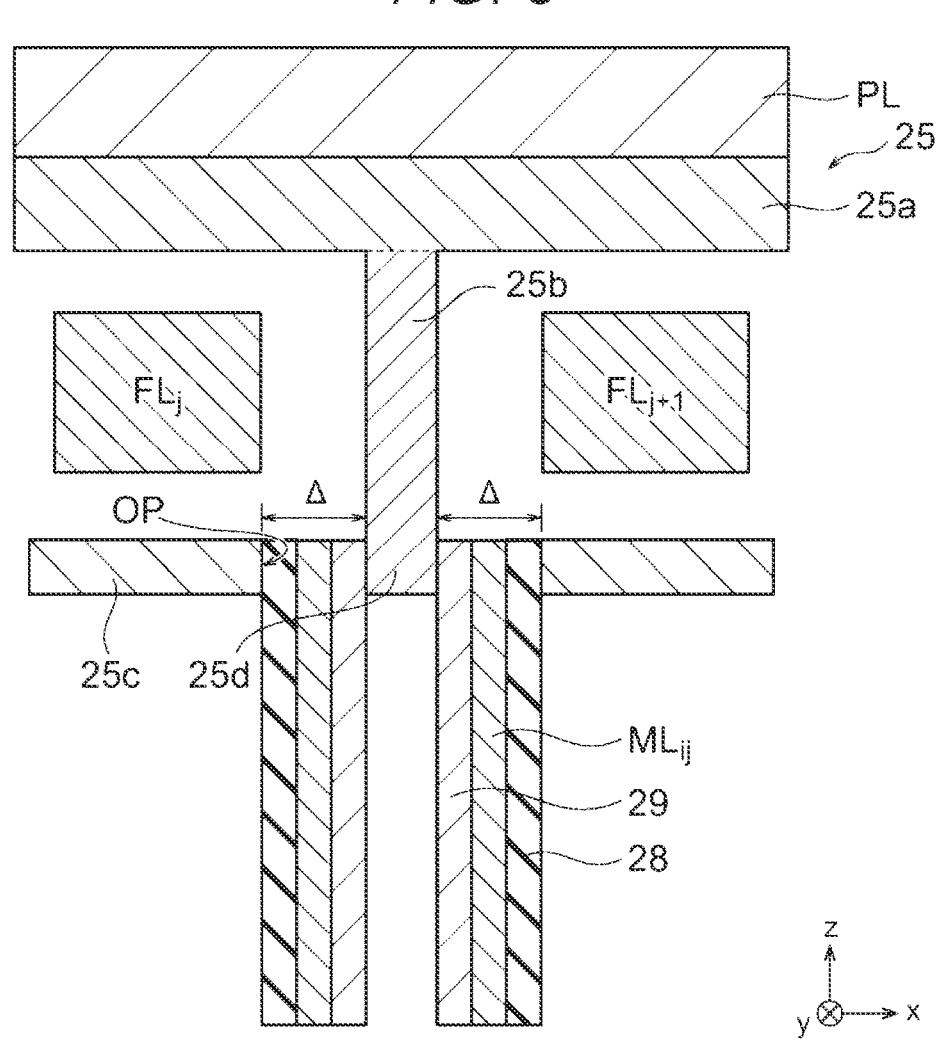
FIG. 5 is a cross-sectional view illustrating another configuration example of yokes.

FIG. 5 is a cross-sectional view illustrating another configuration example of the yokes 25a to 25d and a periphery of the yokes 25a to 25d. A magnetic gap of the magnetic circuit 25 can also be obtained with the configuration illustrated in FIG. 5. The case in FIG. 5 illustrates a non-magnetic conductive layer 29 is provided between each magnetic member $ML_{ij}$ and the yoke 25d. The non-magnetic conductive layer 29 is disposed on the inner surface of each magnetic member $ML_{ij}$. In the case illustrated in FIG. 5, each magnetic gap $\Delta$ is the sum of the thickness of the non-magnetic conductive layer 29 in the x-direction, the thickness of the magnetic member $ML_{ij}$ in the x-direction, and the thickness of the insulating layer 28 in the x-direction. In FIGS. 4 and 5, a non-magnetic conductive layer may be adopted instead of the insulating layer 28. In addition, each magnetic member $ML_{ij}$ may have a stacked layer structure comprising a magnetic layer (for example, CoFeB) and an insulating layer (for example, MgO). In this case, it may be preferable to remove the portion of the insulating layer at the connection position with the yoke 25d and bring the yoke 25d and the magnetic layer into direct contact to electrically connect the yoke 25d and the magnetic layer. Since the MgO layer is generally an extremely thin layer, a leak current may flow through this layer. Therefore, the MgO layer may not need to be removed in all instances.

In addition, although each magnetic member $ML_{ij}$ is electrically connected to the yokes 25b and 25d in the present embodiment, the magnetic member $ML_{ij}$ may be electrically connected to the yoke 25c instead. In this case, the yoke 25c is preferably electrically connected to the yoke 25a at another location (e.g., at a position at some point along the y-direction). A non-magnetic layer may be provided between each magnetic member $ML_{ij}$ and at least one of the yokes 25d and 25c. Furthermore, each magnetic member $ML_{ij}$ may be electrically connected to both the yoke 25d and the yoke 25c. In this case, a non-magnetic conductive layer may be provided between each magnetic member $ML_{ij}$ and at least one of the yokes 25d and 25c.

Returning to FIG. 2 again, the magnetic memory of the first embodiment will be described. The magnetoresistive element $14_{ij}$ reads information written in the magnetic member $ML_{ij}$, and for example, a magnetic tunnel junction (MTJ) element is used. In the following description, the magnetoresistive element $14_{ij}$ is a MTJ element and will be referred to as "MTJ element $14_{ij}$" in this context. The MTJ element $14_{ij}$ includes a free layer 14a (magnetization free layer) for which the magnetization direction is variable, a fixed layer 14c (reference layer) for which the magnetization direction is fixed, and a non-magnetic insulating layer 14b disposed between the free layer 14a and the fixed layer 14c. In the MTJ element $14_{ij}$, the free layer 14a is electrically connected to the first end portion 11a (see FIG. 3) of the magnetic member $ML_{ij}$ via the corresponding non-magnetic conductive layer $12_{ij}$, and the fixed layer 14c is electrically connected to corresponding vertical thin film transistor $18_{ij}$ via the corresponding non-magnetic conductive layer $16_{ij}$. In this context, the "magnetization direction is variable" means that the magnetization direction can be changed by a magnetic field or the like from the corresponding magnetic member $ML_{ij}$ in a read operation, and the "magnetization direction is fixed" means that the magnetization direction is not changed by the magnetic field from the corresponding magnetic member $ML_{ij}$ in normal operation.

The vertical thin film transistor $18_{ij}$ includes one end electrically connected to the fixed layer 14c of the magnetoresistive element $14_{ij}$ via the non-magnetic conductive layer $16_{ij}$ and the other end electrically connected to the bit line $BL_i$ via the non-magnetic conductive layer $19_{ij}$. A channel layer 18a extends in the z-direction, and a gate electrode portion $SG_j$ surrounds or is adjacent to at least a portion of the channel layer 18a. That is, the gate electrode portion $SG_j$ covers at least a part of the channel layer 18a. The channel layer 18a comprises, for example, crystalline silicon. The gate electrode portion $SG_j$ extends along the y-direction, and is connected to and controlled by the control circuit 100.

As illustrated in FIG. 2, yokes 25a, 25b, 25c, and 25d surround a part of each of the field lines $FL_1$ to $FL_{n+1}$. For example, yoke 25a faces and covers an upper surface of each of the field lines $FL_1$ to $FL_{n+1}$, a yoke 25c (also called a return yoke) faces a lower surface of each of the field lines $FL_1$ to $FL_{n+1}$ individually, and a yoke 25b connects the yoke 25a to a yoke 25d and is disposed between each adjacent pair of the field lines $FL_1$ to $FL_{n+1}$. The yoke 25a is disposed spaced from the upper surface of each of the field lines $FL_1$ to $FL_{n+1}$, the yoke 25b is disposed spaced from a side surface of the field lines $FL_1$ to $FL_{n+1}$, and the yoke 25c is disposed spaced from a lower surface of the field lines $FL_1$ to $FL_{n+1}$. As illustrated in FIGS. 4 and 5, a yoke 25d is inserted into each magnetic member $ML_{ik}$ from the second end portion 11b, and is thus electrically connected to the corresponding magnetic member $ML_{ik}$.

Write Method

Figure 6:
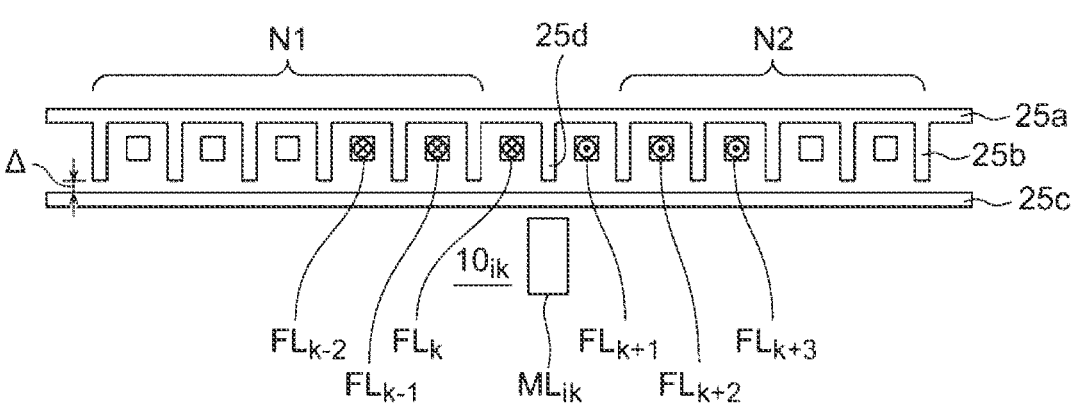
FIG. 6 is a diagram illustrating a case where information is written to a magnetic member of a memory unit.

Next, a write method for the magnetic memory according to the present embodiment will be described with reference to FIG. 6. FIG. 6 is a diagram illustrating a case where information is written to the magnetic member $ML_{ik}$ of the memory unit $10_{ik}$ in the i-th row and the k-th column, where i and k are positive integers. In this case, a write current is divided and flows into the N1 field lines $FL_k$, $FL_{k-1}$, . . . and $FL_{k-N1+1}$ located on an upper left side of the memory unit $10_{ik}$, and a reverse write current is divided and flows into the N2 field lines $FL_{k+1}$, $FL_{k+2}$, . . . and $FL_{k+N2}$ located on an upper right side of the memory unit $10_{ik}$. For example, a write current flowing from a near side in a depth direction flows into the N1 field lines ($FL_k$, $FL_{k-1}$, . . . and $FL_{k-N1+1}$) and a write current flows from a far side in a near side to the N2 field lines ($FL_{k+1}$, $FL_{k+2}$, . . . and $FL_{k+N2}$).

Figure 7:
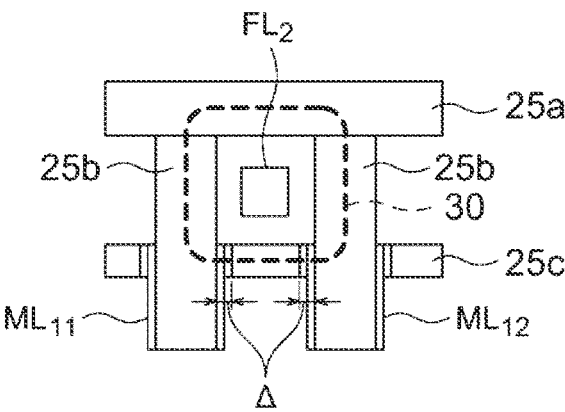
FIG. 7 is a diagram illustrating a write operation when current is not divided.

A write operation is also possible even when a write current is divided between a plurality of field lines. FIG. 7 is a schematic diagram illustrating a case where a write is performed by applying a write current of, for example, 2 mA to the field line $FL_2$ illustrated in FIG. 2. In this case, the yokes $25b$ and $25a$ on the magnetic member $ML_{11}$, the yoke $25b$ on the magnetic member $ML_{12}$, and the yoke $25c$ between the magnetic members $ML_{12}$ and $ML_{11}$ form a magnetic circuit 30 indicated by broken lines in FIG. 7. In this magnetic circuit 30, the magnetic gap $\Delta$ is provided between the yoke $25c$ and the magnetic member $ML_{11}$, and the magnetic gap $\Delta$ is provided between the yoke $25c$ and the magnetic member $ML_{11}$. If a size of each of these magnetic gaps $\Delta$ is L and a current value passing through the magnetic circuit 30 is I, then the magnetic field intensity (H) for these magnetic gaps $\Delta$ is H=I/(2L) according to Ampere's law. For FIG. 7, I=2 mA, so H=2 mA/(2L). A magnetic resistance of the yokes $25a$, $25b$, and $25c$ in the magnetic circuit 30 is assumed to be zero for this example.

Figure 8:
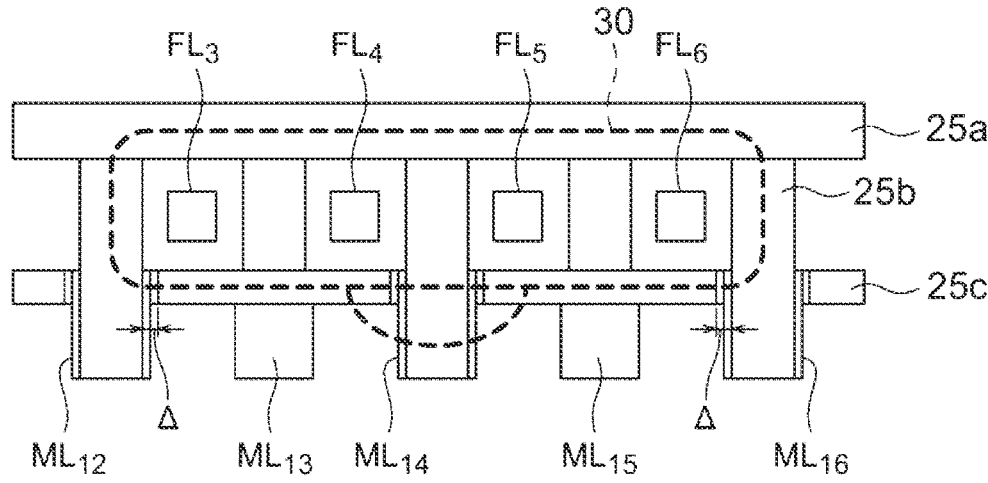
FIG. 8 is a diagram illustrating a write operation when current is divided.

FIG. 8 illustrates a schematic diagram of a case where a write current is divided and applied to four field lines. FIG. 8 is a schematic diagram corresponding in general to a cross section cut along a cutting line B-B illustrated in FIG. 1. In FIG. 8, the yokes $25b$ and $25a$ on the magnetic member $ML_{12}$ and the yokes $25b$ and $25c$ on the magnetic member $ML_{16}$ form the magnetic circuit 30 indicated by broken lines in FIG. 8. In this magnetic circuit 30, the magnetic gap $\Delta$ is between the yoke $25c$ and the magnetic member $ML_{12}$ and between the yoke $25c$ and the magnetic member $ML_{16}$. Although it appears that a magnetic gap would also be between the magnetic member $ML_{14}$ and the yoke $25c$, the yoke $25c$, as can be seen from FIG. 1, is continuously connected to form the magnetic circuit 30 around an outside of the magnetic member $ML_{14}$. Therefore, no magnetic gap is generated between the magnetic member $ML_{14}$ and the yoke $25c$. Regarding the magnetic field intensity H in the magnetic gaps in the case illustrated in FIG. 8, if a length of each of these magnetic gaps $\Delta$ is L and a current value passing through the magnetic circuit 30 I, a magnetic field intensity H at these magnetic gaps $\Delta$ is H=I/(2L) according to Ampere's law. In FIG. 8, I=0.5 mA×4=2 mA, so that H=2 mA/(2L). That is, the magnetic field intensity at the magnetic gap $\Delta$ is the same as in the case illustrated in FIG. 7. This means that even if the write current is divided into a plurality of field lines, the same write operation can be performed as when the current is not divided.

In the present embodiment, a write current flows into a field line located on an upper left side of a memory unit into which information is written and a reverse write current flows into a field line located on an upper right side of the memory unit that performs a write operation. It will be described that saturation of a yoke can be avoided by performing this write operation with reference to FIGS. 9A to 10B.

Figure 9A:
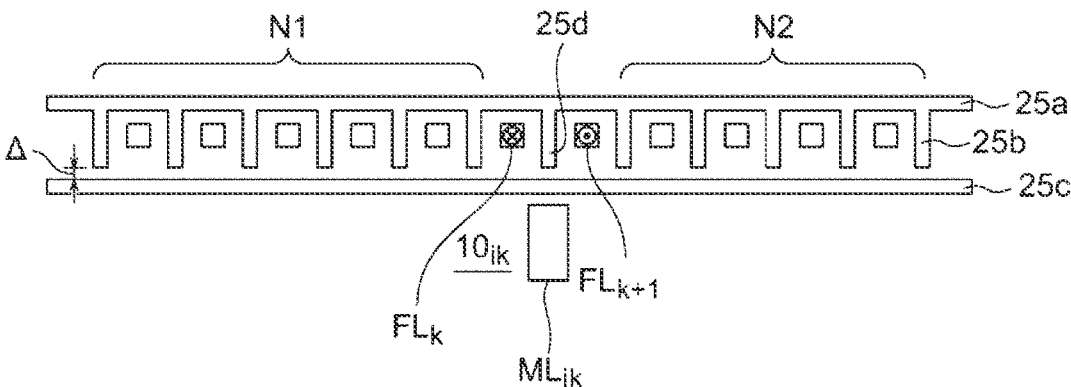
FIGS. 9A and 9B are diagrams illustrating aspects of a write operation for avoiding saturation of a yoke.
Figure 9B:
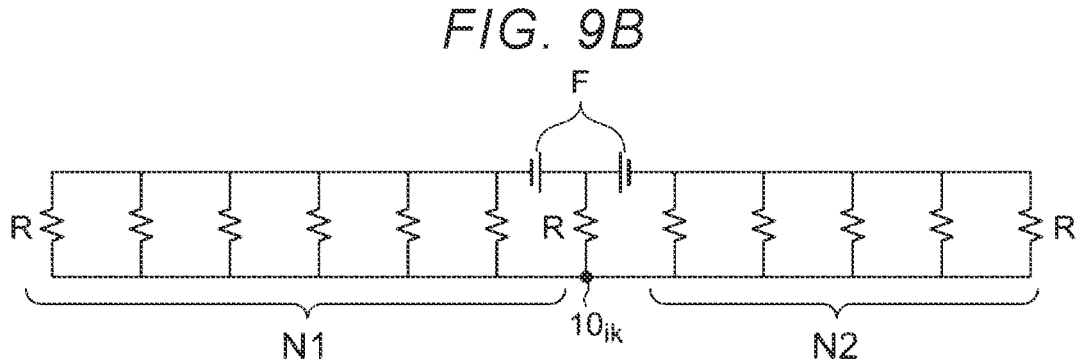

FIG. 9A is a schematic diagram of a case where write currents of the same magnitude but different directions flow into the adjacent field lines $FL_k$ and $FL_{k+1}$, and the write current does not flow into the other field lines in FIG. 6. A magnetic circuit in this case is illustrated in FIG. 9B. Since write currents of the same magnitude and different directions flow into the field line $FL_k$ and the field line $FL_{k+1}$, magnetomotive forces F in opposite directions are generated on the left and right sides of the write memory unit $10_{ik}$. Since the magnetic gap $\Delta$ is provided between each yoke $25b$ and the return yoke $25c$, this magnetic gap $\Delta$ becomes a magnetic resistor R.

In FIG. 9B, since N1 magnetic resistors R are connected in parallel in a circuit on a left side of the write memory unit $10_{ik}$, a combined magnetic resistance is R/N1. Since the N2 magnetic resistors R are connected in parallel in a circuit on a right side of the write memory unit $10_{ik}$, the combined magnetic resistance is R/N2. That is, the magnetic circuit illustrated in FIG. 9B is represented by an equivalent magnetic circuit illustrated in FIG. 10A. In this equivalent magnetic circuit, two magnetomotive forces F are connected in parallel.

Figure 10A:
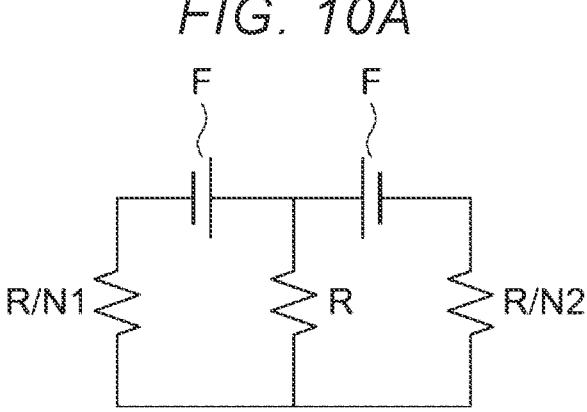
FIGS. 10A and 10B are diagrams illustrating aspects of a write operation for avoiding saturation of a yoke.

In FIG. 10A, it is assumed that N1 and N2 are large, combined resistances R/N1 and R/N2 are thus much smaller than a resistance of the magnetic resistor R in the write memory unit $10_{ik}$, and a magnetic flux $\varphi$ flowing through the magnetic circuit 25 by the magnetomotive force F is F/R.

Figure 10B:
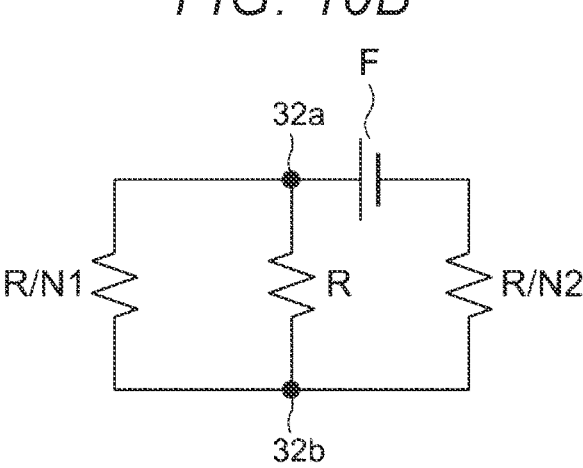

FIG. 10B illustrates an equivalent magnetic circuit when a write current flows into the field line $FL_{k+1}$ but no write current flows into the other field lines in FIG. 9A. Also, in FIG. 10B, since the combined resistances R/N1 and R/N2 are smaller than the resistance of the magnetic resistor R of the yoke 32 and the magnetomotive force F is not provided in the magnetic circuit on the left side, terminals $32a$ and $32b$ of the resistor R in the write memory unit $10_{ik}$ are almost short-circuited. Therefore, the extremely large magnetic flux $\varphi$ flows into a yoke corresponding to the write memory unit $10_{ik}$, and magnetic saturation occurs in this magnetic resistor R.

However, as in the present embodiment, as illustrated in FIG. 9A, by applying write currents of the same magnitude but different directions to both sides of the yoke corresponding to the write memory unit, the occurrence of the magnetic saturation can be reduced.

Figure 11:
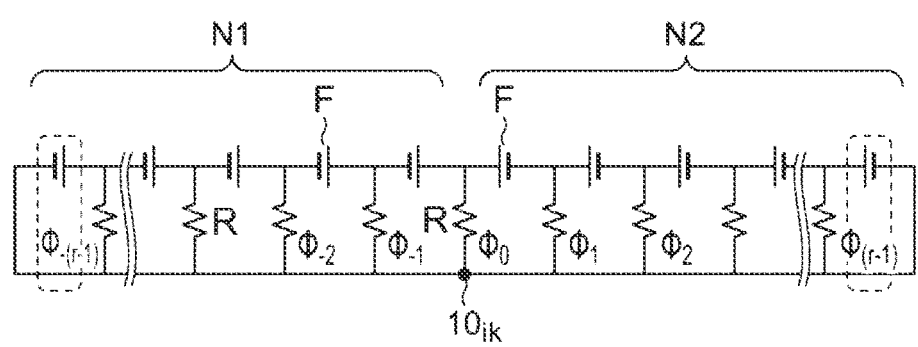
FIG. 11 is a diagram illustrating an estimation of magnetic flux in writing in a magnetic memory according to a first embodiment.

Next, a magnetic flux generated when write currents divided in opposite directions are applied to each of r (where r<N1, r<N2) field lines on both sides of the write memory unit in the magnetic memory illustrated in FIG. 6 will be described with reference to FIG. 11. FIG. 11 is a magnetic circuit diagram in this case. A magnetic flux generated in a magnetic gap corresponding to the write memory unit $10_{ik}$ is set to $\varphi_0$, a magnetic flux generated in a magnetic gap corresponding to the j-th memory unit (j=1 to r−1) on a left side of the write memory unit $10_{ik}$ is set to $\varphi_{-j}$, and a magnetic flux generated in a magnetic gap corresponding to the j-th memory unit (j=1 to r−1) on a right side of the write memory unit $10_{ik}$ is set to $\varphi_j$. At this time, these magnetic fluxes satisfy the following relational equations:

$$\varphi_{-(r-1)} = \varphi_{r-1} = F/R,$$

$$\varphi_{-(r-2)} = \varphi_{r-2} = 2F/R,$$

$$\cdots$$

$$\varphi_0 = rF/R$$

In this case, the highest magnetic flux density in the yoke is the outermost region (the region indicated by the broken line in FIG. 11) through which the write current flows. The magnetic flux passing through this region is as follows:

$$\sum_{n=1}^{r-1} \phi_n + \frac{\phi_0}{2} = \frac{r^2 F}{2R}$$

A ratio of the magnetic flux in the region described above to the magnetic flux $\varphi_0$ passing through the write memory unit is as follows:

$$\frac{\frac{r^2 F}{2R}}{\frac{rF}{R}} = \frac{r}{2}$$

An upper limit of the above ratio varies greatly depending on such things as film thickness of the yoke, magnetic properties, and the like. In FIG. 11, a combined magnetic resistance of a memory unit in a region outside a region in which a magnetic flux density is the highest is R/(N1−r) on a left side of the write memory unit and R/(N2−r) on a right side of the write memory unit. Assuming N1, N2>>r, the combined magnetic resistance can be considered substantially zero.

Figure 12A:
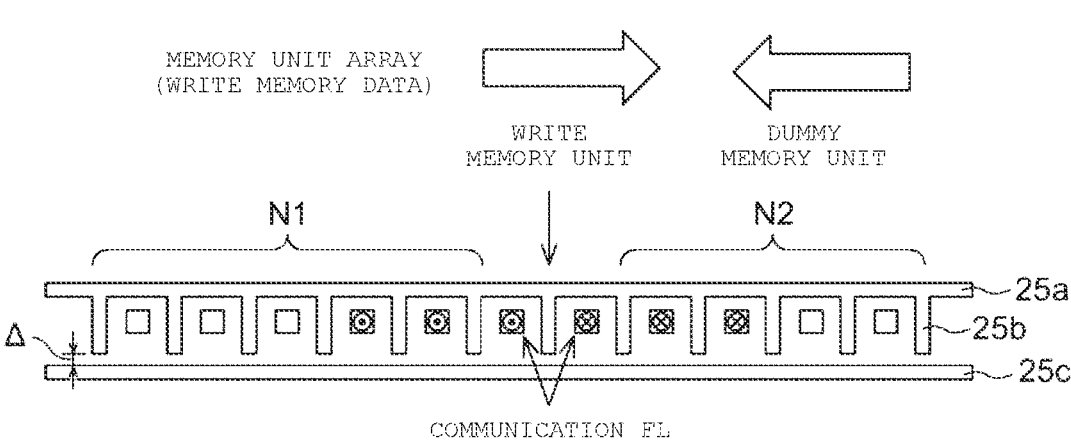
FIGS. 12A and 12B are diagrams illustrating aspects related to a write operation at an end portion of a memory unit array.
Figure 12B:
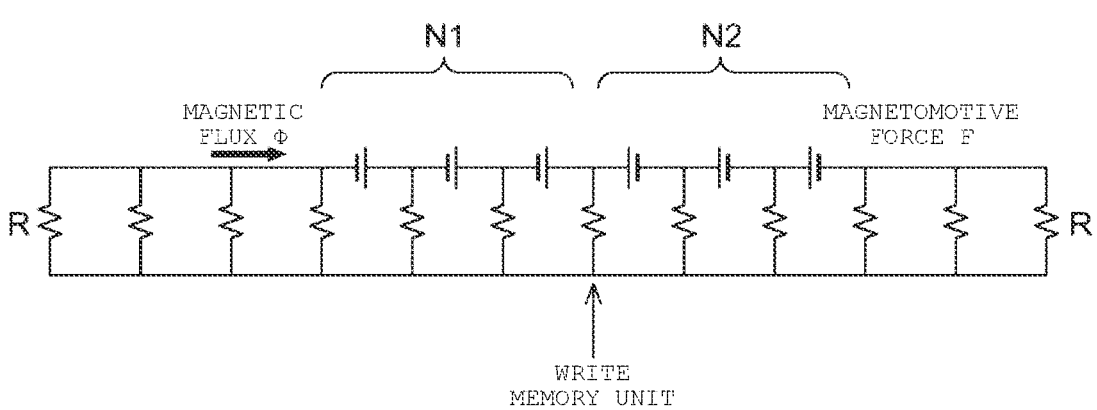

Next, a write to a memory unit at an end portion of a memory unit array will be described with reference to FIGS. 12A and 12B. FIG. 12A is a diagram illustrating aspects related to a write operation occurring at an end portion of a memory unit array, and FIG. 12B illustrates an equivalent magnetic circuit for FIG. 12A. The present embodiment has a configuration in which a dummy memory unit array is provided at an outside of a memory unit array for a write to a memory unit at an end portion. As illustrated in FIGS. 12A and 12B, the write to the memory unit at the end portion is performed by applying a write current flowing from a depth direction to a front direction of the drawing to the r field lines on a left side of the memory unit and applying a write current flowing from the front to the depth of the drawing, for example, to the r field lines on the right side of the memory unit (the field lines may be in the memory unit array or the dummy memory unit array). The write current flowing through the r field lines on the left side and the write currents flowing through the r field lines on the right side of the memory unit to which information is written have the same magnitude but different directions. In this manner, the write at the end portion of the memory unit array can be performed.

If the number of field lines through which the write current flows among the field lines located on one side of the memory unit on which the write is to be performed is set to r, it is preferable to provide at least r columns or more of the dummy memory units.

The yoke 25a, the return yoke 25c, and the field line FL (illustrated in FIG. 6) are provided for the dummy memory unit. However, the magnetic member ML may or may not be provided in such a dummy memory unit. When the magnetic member ML is provided, the magnetic member ML might not be electrically connected to at least one of the plate electrode PL or the bit line BL. It is generally preferable that the yoke 25b and the yoke 25d are also provided in a dummy memory region since it is preferable to maintain symmetry with respect to a write memory region in the combined region formed by the edge portion of the memory region and the dummy memory region.

Further, when the dummy memory units of the r columns or more are provided, a field line need not be provided at beyond the r+1-th column.

In addition, the yoke 25a and the return yoke 25c beyond the r+1-th column illustrated in FIG. 6 may be brought into contact with each other, that is, the magnetic gap may be eliminated to provide a cell in which a magnetic resistance is zero. Instead of eliminating the magnetic gap, end portions of the yoke 25a and the return yoke 25c may be magnetically connected to each other. Therefore, at a time of the write, magnetic resistances on both sides of the write memory unit will be the same. This is because, in FIG. 12B, a combined magnetic resistance of the memory unit outside the r+1-th column on the left side with respect to the write memory unit is substantially zero.

As described above, in the present embodiment, when the write is performed on the memory unit, the write currents divided in opposite directions flow to the field lines of the r columns on both sides of the write memory unit. When the write is performed to the memory unit at the end portion (outer edge) of the memory unit array, by including the dummy cell(s), write currents divided in opposite directions flow in the field lines of r columns on both sides of the write memory unit (the memory unit being written). Therefore, a write can be performed even if a magnitude of the current flowing through one field line is small, and it is possible to reduce the occurrence of electro-migration in the field line, and it is possible to reduce occurrence of disconnection.

When a write is performed to the memory unit, a write current I1 flowing through each field line of the r1 column on the left side of the write memory unit and a write current I2 flowing through each field line of the r2 column on the right side of the write memory unit satisfy a relationship of I1×r1=I2×r2. When this relationship is satisfied, the same magnetic field is applied to the write memory unit from the left and right. The same magnetic field does not necessarily have to be applied from the left and right, but it is generally preferable that the same magnetic field is applied to the write memory unit from the left and right in order to avoid saturation of the magnetic body.

In the present embodiment, in one write operation, one piece of information, for example, information "1" is written into the memory unit arranged in one column at the same time. For example, if k is a natural number of n or less, the information "1" is written into the m memory units $10_{1k}$, to $10_{mk}$ arranged in k-th column. Subsequently, a shift current selectively flows between the plate electrode PL and the bit line $BL_{2j}$ corresponding to the memory unit in which the information "1" is to be stored, in relation to the memory unit (for example, memory unit $10_{2jk}$ of even number row) and the information described above is moved to the magnetoresistive element side. Therefore, the information "1" is stored. Here, j is a natural number of 1 to m/2. After that, the information "0" is written to the memory unit arranged in the k-th column. Subsequently, a shift current selectively flows into a memory unit other than the memory unit storing the information "1", for example, the memory unit of the odd number row of the k-th column to move the information to the magnetoresistive element side. By the above two operations, the write of the information to the memory units arranged in the k-th column is completed. In one write operation, one piece of information is written in the memory units arranged in one column at the same time, so that write power consumption per bit can be reduced.

Figure 13:
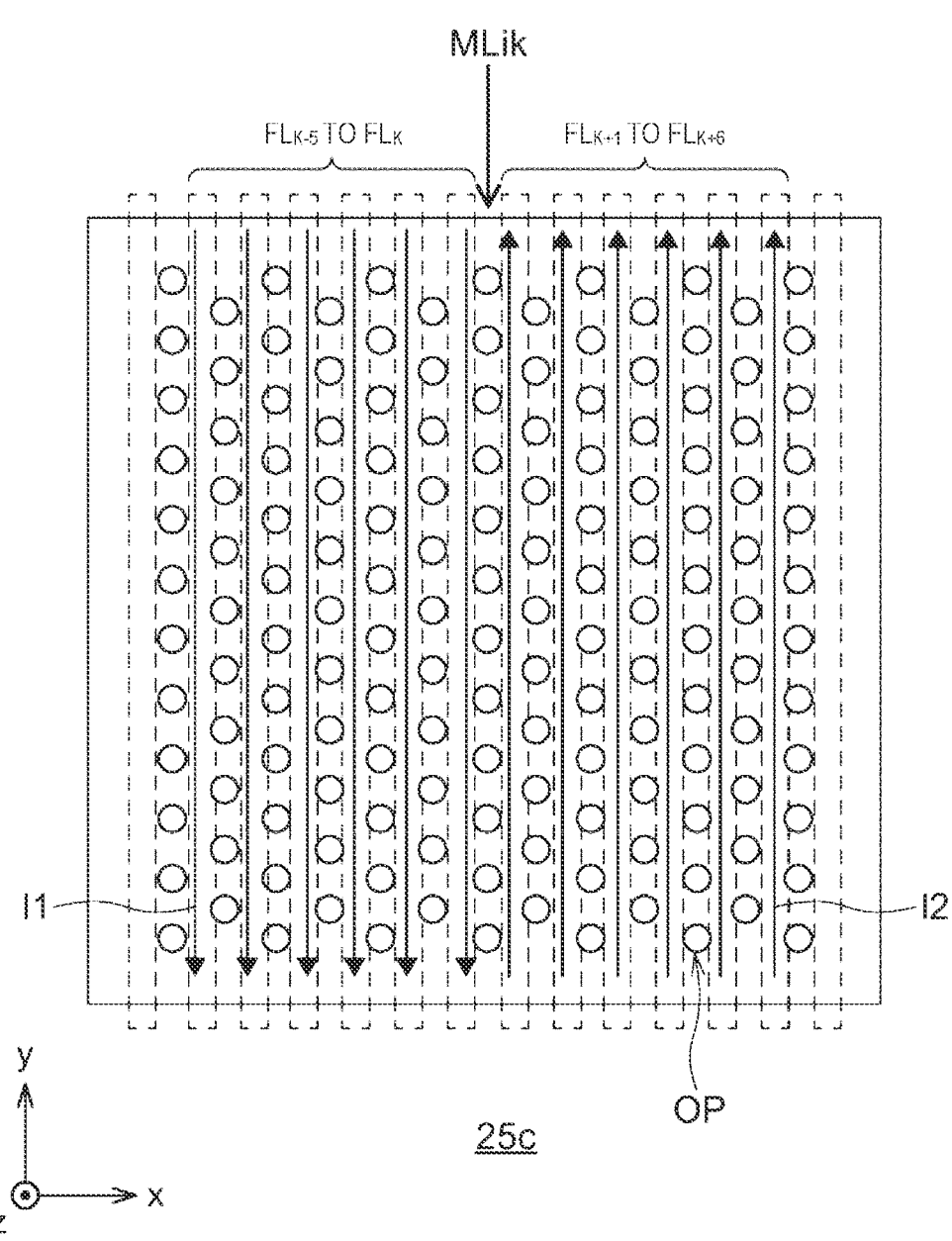
FIG. 13 is a plan view illustrating a configuration example of a yoke.

FIG. 13 is a plan view illustrating a configuration example of the yoke 25c. The yoke 25c (return yoke) has an opening OP provided corresponding to each of the plurality of magnetic members $ML_{ij}$, in the plan view in the z-direction. The second end portion 11b of the magnetic member $ML_{ij}$ and the yoke 25d (lower portion yoke 25d of the yokes 25b and 25d) are provided in the corresponding opening OP, as illustrated in FIG. 4 or 5.

In this manner, when the yoke 25c is provided with a large number of openings OP, if the yoke 25c is made of a material with the large saturation magnetization Ms in the same manner as the yokes $25b$ and $25d$, a magnetization response of the yoke $25c$ will be lowered, so it becomes difficult for the magnetic flux to pass through the yoke $25c$. In this case, as illustrated in FIG. 13, when the write currents I1 and I2 in opposite directions are supplied to the field lines $FL_{k-5}$ to $FL_k$ and the field lines $FL_{k+1}$ to $FL_{k+6}$ on both sides of the magnetic member $ML_{ik}$ of a write target, the direction of the magnetic field is not stable.

Figure 14:
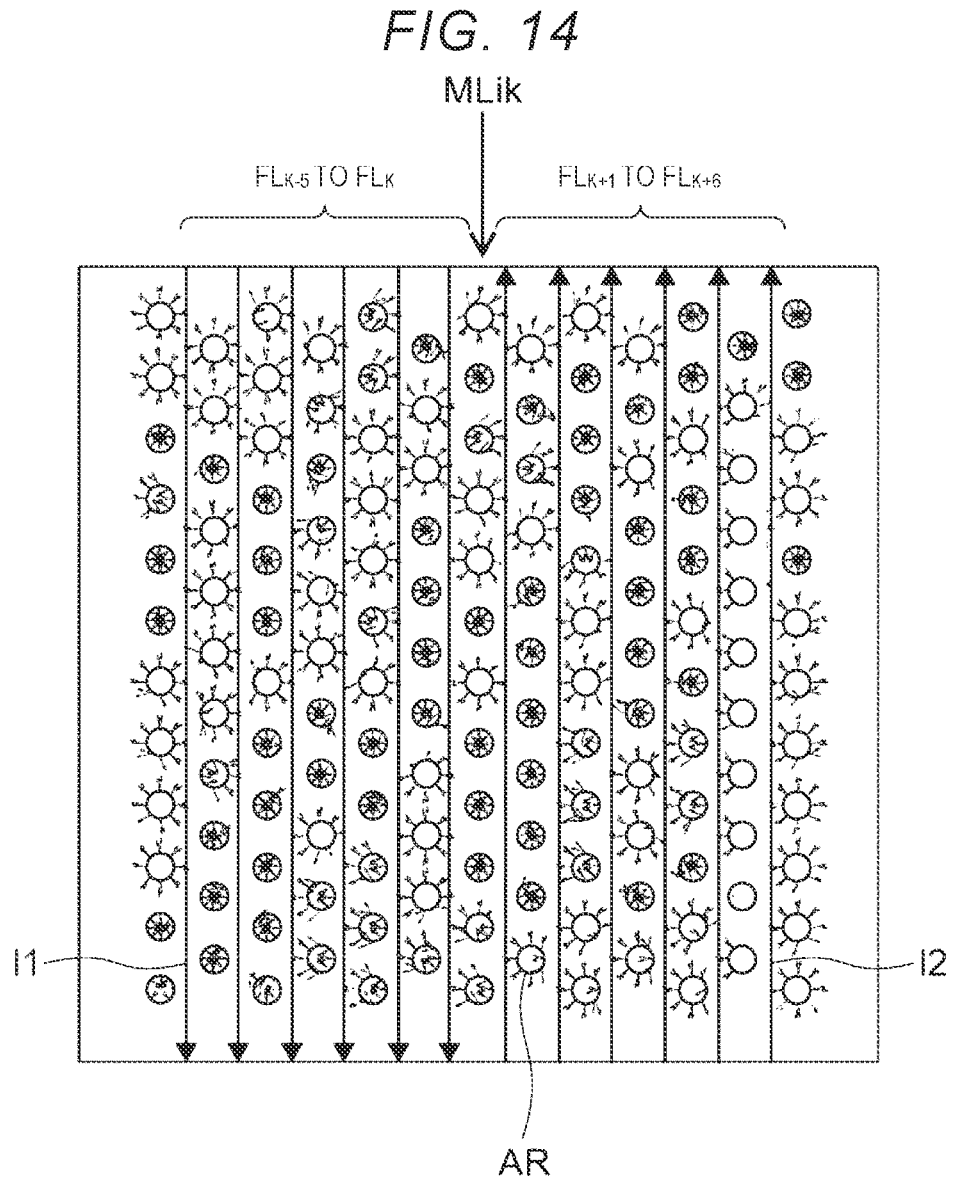
FIG. 14 is a schematic plan view illustrating a magnetization direction when certain yokes are made of identical high saturation magnetization materials as other yokes.

For example, FIG. 14 is a schematic plan view illustrating a magnetization direction when the yokes $25c$ and $25a$ are made of identical high saturation magnetization materials (for example, FeCo) as the yokes $25b$ and $25d$. When saturation magnetization of the yoke $25c$ is high, a direction of a magnetic field direction (arrow AR in FIG. 14) at the opening OP is not stable in the row of magnetic members $ML_{ij}$ of a write target. In addition, the direction of the magnetic field direction at the opening OP is not symmetrical with respect to the row of the magnetic member $ML_{ij}$, in a region other than the rows of the magnetic member $ML_{ij}$, and is also not stable.

In this case, it may not be possible to write logical data in the magnetic member $ML_{ij}$ of a write target in accordance with the directions of the write currents I1 and I2.

However, in the present embodiment, the yoke $25c$ is made of a material having a smaller saturation magnetization Ms than the yokes $25b$ and $25d$. In this case, the magnetization response of the yoke $25c$ is increased, so it becomes easier for the magnetic flux to pass through the yoke $25c$. Therefore, as illustrated in FIG. 13, when the write currents I1 and I2 in opposite directions are supplied to the field lines $FL_{k-5}$ to $FL_k$ and the field lines $FL_{k+1}$ to $FL_{k+6}$ on both sides of the magnetic member $ML_{ik}$ of a write target, the direction of the magnetic field is easily stabilized in a desired direction.

Figure 15:
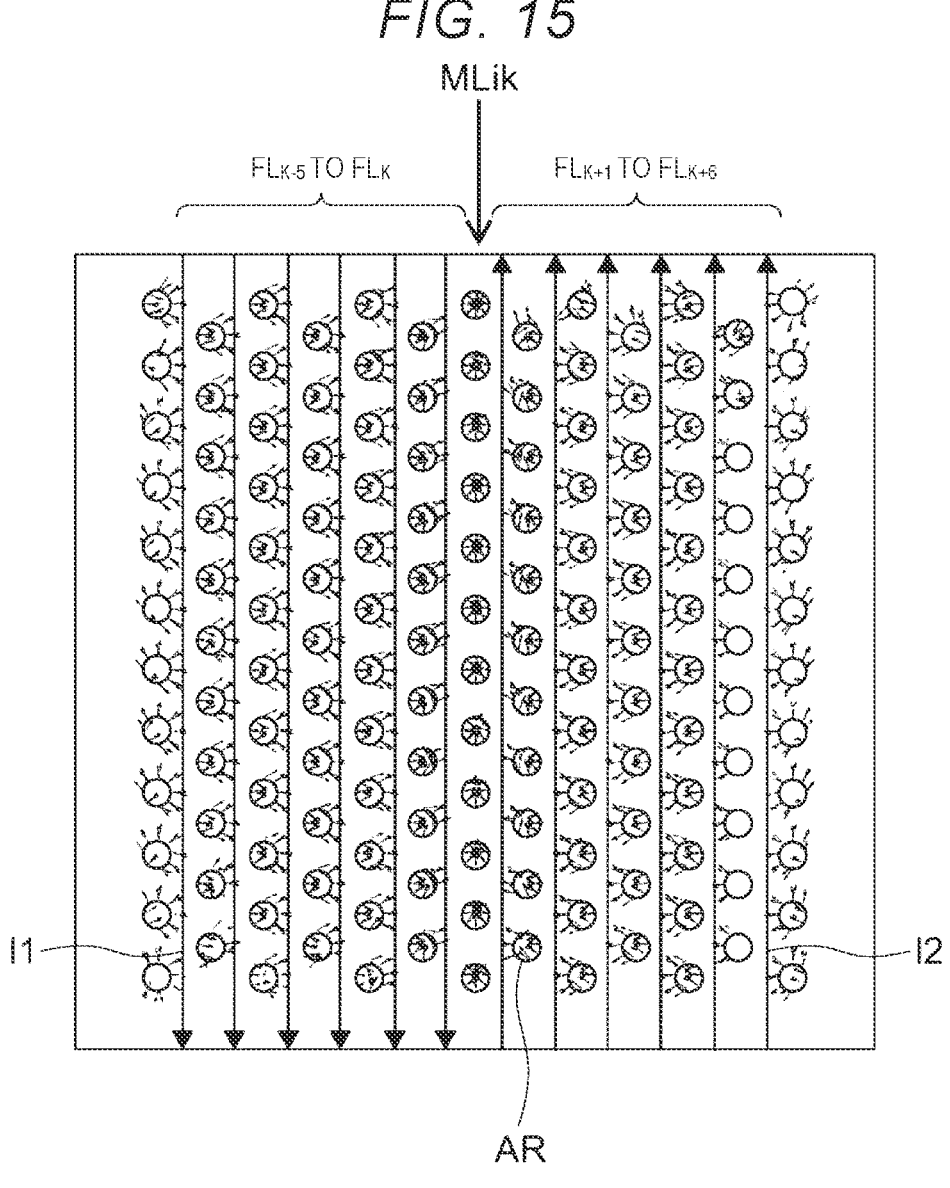
FIG. 15 is a schematic plan view illustrating a magnetization direction when certain yokes 25c and 25a are made of low saturation magnetization materials different from other yokes.

For example, FIG. 15 is a schematic plan view illustrating a magnetization direction when the yokes $25a$ and $25c$ are made of a low saturation magnetization material (for example, permalloy to which a non-magnetic material is added and the like) different from the material of the yokes $25b$ and $25d$. When the saturation magnetization of the yoke $25c$ is lower than the saturation magnetization of the yokes $25b$ and $25d$, a direction of a magnetic field direction (arrow AR in FIG. 15) at the opening OP is stable in the row of magnetic members $ML_{ij}$ of a write target.

In FIG. 15, the magnetic field direction is directed toward a center of the openings OP for all the openings OP in the row of magnetic members $ML_{ij}$. Further, the direction of the magnetic field direction in the opening OP is symmetrical with respect to the row of the magnetic members $ML_{ij}$, in a region other than the rows of the magnetic members $ML_{ij}$. That is, the magnetic field direction is almost the same as a desired direction for each row of the magnetic members ML, and is stable.

Therefore, logical data can be written in the magnetic member $ML_{ij}$ of a write target in accordance with the directions of the write currents I1 and I2.

The yoke $25a$ facing the yoke $25c$ to sandwich the yokes $25b$ and $25d$ in the z-direction is also made of the same material as the yoke $25c$. That is, the yoke $25a$ is made of a material having a smaller saturation magnetization Ms than the yokes $25b$ and $25d$. In this case, magnetic permeability of the yoke $25a$ is also increased, so it becomes easier for the magnetic flux to pass through the yoke $25a$ as well. Therefore, when the write currents I1 and I2 in opposite directions are supplied to the field lines $FL_{k-5}$ to $FL_k$ and the field lines $FL_{k+1}$ to $FL_{k+6}$ on both sides of the magnetic member $ML_{ik}$ of a write target, the direction of the magnetic field is easily stabilized in the yoke $25a$ as well. At least any of the yokes $25a$ and $25c$ may have a smaller saturation magnetization Ms than the yokes $25b$ and $25d$. Therefore, it is easier to stabilize the direction of the magnetic field.

Therefore, at least one of the yokes $25a$ and $25c$ may be made of a material having a lower saturation magnetization Ms than the yokes $25b$ and $25d$. Therefore, in the magnetic circuit, the magnetic field of the opening OP is stabilized in a desired direction, and a desired magnetic field can be applied to the magnetic member $ML_{ik}$ of the memory unit $10_{ik}$. It is possible to improve an intensity of the write magnetic field applied to the magnetic member $ML_{ik}$ and reduce variations in the write magnetic field. As a result, write efficiency of the data is improved.

The yokes $25b$ and $25d$ are made of a material having the higher saturation magnetization Ms than the yokes $25a$ and $25c$. Therefore, magnetic saturation of the magnetic circuit 25 configured with the yokes $25a$ to $25d$ can be reduced.

When the yoke $25c$ has a lower saturation magnetization Ms than the yokes $25b$ and $25d$, the yoke $25a$ may be integrally made of the identical material as the yokes $25b$ and $25d$. That is, the yoke $25c$ may be made of a material having a lower saturation magnetization Ms than the yokes $25a$, $25b$, and $25d$ (which are integrally made of the same material). Even in this case, the direction of the magnetic field is easily stabilized.

Read Method

Next, a read method will be described. When information is read from a memory unit, for example, when the information is read from the memory unit $10_{12}$, when the information to be read is located at the lowermost portion of the magnetic member $ML_{12}$ of the memory unit $10_{12}$, that is, a region closest to the MTJ element $14_{12}$, a magnetization direction of the free layer $14a$ of the MTJ element $14_{12}$ is also changed in accordance with the information stored in the lowermost portion of the magnetic member $ML_{12}$. Therefore, the control circuit 100 is used to apply a read current between the plate electrode PL and the bit line $BL_1$ to read the information from the MTJ element $14_{12}$. This read information corresponds to a resistance state of the MTJ element $14_{12}$. For example, when a resistance of the MTJ element $14_{12}$ is high, the magnetization directions of the free layer $14a$ and fixed layer $14c$ of the MTJ element $14_{12}$ are closer to antiparallel (for example, 90 degrees or more) than when the resistance is low. When the resistance of the MTJ element $14_{12}$ is low, the magnetization directions of the free layer $14a$ and the fixed layer $14c$ of the MTJ element $14_{12}$ are closer to parallel (for example, 90 degrees or less) than when the resistance is high.

When the information to be read is not in the lowermost portion of the magnetic member $ML_{12}$ of the memory unit $10_{12}$, the control circuit 100 is used to apply a shift current between the plate electrode PL and the bit line $BL_1$, and the information to be read is eventually moved to the lowermost portion of the magnetic member $ML_{12}$. After that, the information can be read by performing the read operation described above.

As described above, with the present embodiment, a write is performed by dividing a write current into a plurality of field lines, so that the write current flowing through each field line can be reduced, and disconnection due to electromigration can be reduced. In addition, with one write operation, information can be written to a plurality of memory units, so that power consumption for the write can be reduced.

Second Embodiment

Figure 16:
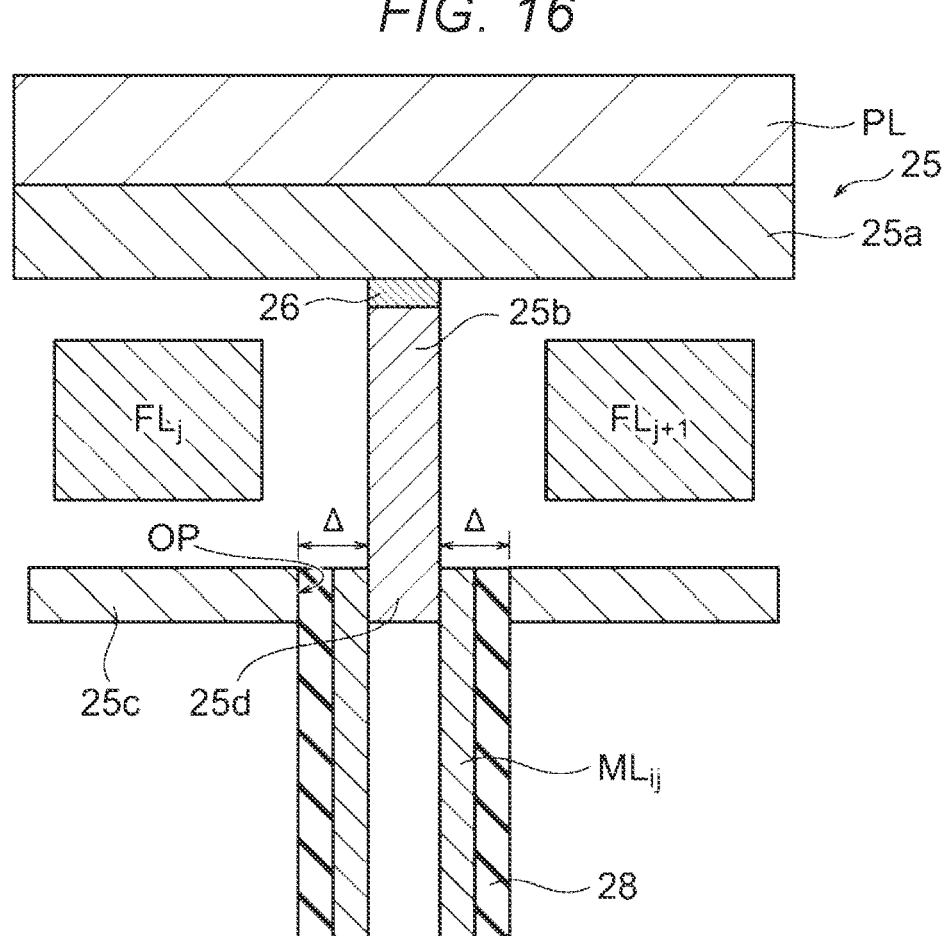
FIG. 16 is a cross-sectional view illustrating a configuration example of yokes according to a second embodiment.

FIG. 16 is a cross-sectional view illustrating a configuration example of yokes according to a second embodiment.

In the second embodiment, a conductive film 26 made of a conductive material different from a material of the yokes 25*a* and 25*b* is provided between the yokes 25*a* and 25*b*. The conductive film 26 is a non-magnetic conductive film, and comprises, for example, Au, Cu, Cr, Zn, Ga, Nb, Mo, Ru, Pd, Ag, Hf, Ta, W, Pt, or the like. Other configurations of the second embodiment may be the same as the corresponding configurations of the first embodiment. For example, the saturation magnetization Ms of the yokes 25*a* and 25*c* is lower than the saturation magnetization Ms of the yokes 25*b* and 25*d*. The exchange stiffness constant A of the yokes 25*a*, 25*c* is also lower than the exchange stiffness constant A of the yokes 25*b*, 25*d*. In addition, a write operation and a read operation of the second embodiment may be the same as the write operation and the read operation operations of the first embodiment.

In this manner, even if the yokes 25*a* and 25*b* are not directly connected and a non-magnetic conductive film 26 is interposed between the yokes 25*a* and 25*b*, the magnetic circuit 25 can still be established. In addition, since materials of the yokes 25*a* and 25*c* are the same as the materials of the first embodiment, in the second embodiment, a strength of a write magnetic field applied to the magnetic member $ML_{ik}$ can be improved and variations in the write magnetic field can be reduced, in the same manner as in the first embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A magnetic memory, comprising:
a plurality of first magnetic members, each first magnetic member extending along a first direction and having a first end portion and a second end portion;
a first wiring and a second wiring spaced apart from one of the plurality of first magnetic members on a second end portion side of the first magnetic member, the first and second wirings extending along a second direction intersecting with the first direction and being adjacent to each other in a third direction intersecting the first and second directions, the one first magnetic member being located at a position between the first wiring and the second wiring in a plan view from the first direction;
a second magnetic member including:
a first portion above the first wiring and the second wiring,
a second portion between the first wiring and the second wiring and electrically connected to the first portion, and
a third portion below the first wiring and the second wiring; and
a third wiring on a first end portion side of the one first magnetic member and extending along the third direction, wherein
at least one of the first portion and the third portion has a lower saturation magnetization than the second portion.

2. The magnetic memory according to claim 1, further comprising:

a conductive film between the first portion and the second portion and including a conductive material different from the first portion and the second portion, wherein the saturation magnetization of the first portion is lower than the saturation magnetization of the second portion.

3. The magnetic memory according to claim 2, wherein the conductive film is a non-magnetic film.

4. The magnetic memory according to claim 1, wherein the saturation magnetization of the third portion is lower than the saturation magnetization of the second portion.

5. The magnetic memory according to claim 4, wherein the first portion and the second portion are integrally made of the same magnetic material.

6. The magnetic memory according to claim 1, wherein an exchange stiffness of at least one of the first portion and the third portion is lower than an exchange stiffness of the second portion.

7. The magnetic memory according to claim 1, wherein,
in the plan view from the first direction, the second portion is provided corresponding to each of the plurality of first magnetic members, and
the second end portion of the one first magnetic member is between the second portion and the third portion.

8. The magnetic memory according to claim 7, wherein, in the plan view from the first direction, the third portion has an opening provided for each of the plurality of first magnetic members, and the second end portion of the first magnetic member and the second portion are within the same opening.

9. The magnetic memory according to claim 8, wherein each of the plurality of first magnetic members is electrically connected to a corresponding second portion.

10. The magnetic memory according to claim 9, further comprising:
an insulating film between the one first magnetic member and the third portion.

11. The magnetic memory according to claim 1, further comprising:
a plurality of magnetoresistive elements each having one end electrically connected to the first end portion of one of the plurality of first magnetic members, respectively.

12. The magnetic memory according to claim 11, further comprising:
a switching element between each of the plurality of magnetoresistive elements and the third wiring.

13. A magnetic memory, comprising:
a plurality of first magnetic members, each extending in a first direction and having a first end portion and a second end portion;
a first wiring and a second wiring on a second end portion side of one of the plurality of first magnetic members and extending in a second direction intersecting with the first direction, the first wiring and the second wiring being spaced from each other in a third direction intersecting the first and second directions, the one first magnetic member being between the first wiring and the second wiring in a plan view from the first direction;
a second magnetic member including a first portion above the first wiring and the second wiring in the first direction, a second portion between the first wiring and the second wiring in the third direction and electrically connected to the first portion, and a third portion below the first wiring and the second wiring in the first direction;
a conductive film between the first portion and the second portion in the first direction; and a third wiring on a first end portion side of the one first magnetic member and extending along the third direction.

14. The magnetic memory according to claim 13, wherein the conductive film is a non-magnetic conductive film.

15. The magnetic memory according to claim 13, wherein the conductive film comprises at least one of gold, copper, chromium, zinc, gallium, niobium, molybdenum, ruthenium, palladium, silver, hafnium, tantalum, tungsten or platinum.

16. The magnetic memory according to claim 13, wherein an exchange stiffness of at least one of the first portion and the third portion is lower than an exchange stiffness of the second portion.

17. The magnetic memory according to claim 13, wherein, in the plan view from the first direction, the third portion has an opening for each of the plurality of first magnetic members.

18. The magnetic memory according to claim 17, further comprising:

an insulating film between the one first magnetic member and the third portion.

19. The magnetic memory according to claim 13, further comprising:

a plurality of magnetoresistive elements, each having an end electrically connected to the first end portion of one of the plurality of first magnetic members.

20. The magnetic memory according to claim 19, further comprising:

a switching element between the third wiring and each of the plurality of magnetoresistive elements.

* * * * *